United States Patent

Ghasripoor et al.

(10) Patent No.: US 6,910,619 B2
(45) Date of Patent: Jun. 28, 2005

(54) BRAZING OF ALUMINA COATED HONEYCOMB AND FIBER METAL

(75) Inventors: Farshad Ghasripoor, Scotia, NY (US); Chek Beng Ng, Albany, NY (US); Raymond Edward Chupp, Glenville, NY (US); Jeffrey R. Thyssen, Delmar, NY (US); Don Mark Lipkin, Niskayuna, NY (US); Dalero W. Berkeley, Greenville, SC (US)

(73) Assignee: General Electric Company, Schenectady, NY (US)

( * ) Notice: Subject to any disclaimer, the term of this patent is extended or adjusted under 35 U.S.C. 154(b) by 204 days.

(21) Appl. No.: 10/452,054

(22) Filed: Jun. 3, 2003

(65) Prior Publication Data

US 2004/0245322 A1 Dec. 9, 2004

(51) Int. Cl.⁷ ............................................... B23K 31/02
(52) U.S. Cl. ........................................................ 228/181
(58) Field of Search ................................. 228/181, 157, 228/203, 262.5; 277/415; 29/23.51, 889, 889.7, 889.71

(56) References Cited

U.S. PATENT DOCUMENTS

| | | | | |
|---|---|---|---|---|
| 3,416,218 A | * | 12/1968 | Armenoff et al. | ........... 228/157 |
| 4,867,639 A | * | 9/1989 | Strangman | ................ 415/173.4 |
| 4,884,820 A | * | 12/1989 | Jackson et al. | ............. 277/415 |
| 5,526,462 A | * | 6/1996 | Kondo et al. | ................ 392/485 |

* cited by examiner

*Primary Examiner*—Jonathan Johnson
(74) *Attorney, Agent, or Firm*—Nixon & Vanderhye

(57) ABSTRACT

Process of brazing an alumina-coated honeycomb and fiber metal material to a substrate, in which a mask material is applied to a portion of the honeycomb and fiber metal prior to deposition of the $Al_2O_3$, and the mask material is removed after deposition and prior to brazing to the substrate.

10 Claims, No Drawings

BRAZING OF ALUMINA COATED HONEYCOMB AND FIBER METAL

The present invention relates to brazing of honeycomb and fiber metal to a substrate, such as a Stage 2 or Stage 3 shroud. More particularly, improved brazability of honeycomb and fiber metal is achieved by partial masking prior to deposition of alumina followed by removal of the masking material prior to brazing to the substrate.

BACKGROUND OF THE INVENTION

Currently, honeycomb seals are used in a number of different locations in gas turbines, for example in stages 2 and 3 of the 7E turbine against rails on shrouded buckets. Honeycomb is used as an abradable system, whereby the rotating rails on the buckets may incur into them during any transient closures between the buckets and the shroud. The incursion into the honeycomb is a sacrificial form of sealing, as the intention is that there be no damage to the bucket rails during the interaction. This allows for tightest possible clearances during the steady state operation of the gas turbine. However, the primary problem with honeycomb, particularly in stage 2 shrouds, is its low resistance to oxidation. The honeycomb material is typically 75Ni-16Cr-4.5Al-3Fe-0.05C-0.01Y-0.5Mn-0.2Si-0.1Zr-0.01B (Haynes 214). The temperature range in this location of the turbine is generally in the range of 1500–1700° F. At ~1600° F., the oxidation life of a 0.005" thick honeycomb is less than 20,000 hours.

An alternative Sealing system currently in use in turbines, particularly gas turbines, consist of a known material called "fiber metal," which is typically Hastelloy-x or a FeCrAlY compound. Because fiber metal is directly exposed to the high temperature gases of the second and third stages, its oxidation life is limited.

A need exists for an improved method of assembly of honeycomb and fiber metal when coated with $Al_2O_3$ to substrates, such as Stage 2 and Stage 3 shrouds. Application of $Al_2O_3$ on honeycomb and fiber metal reduces the wetting of the seal surface by braze material, which leads to poor bonding between the seal and the substrate. The present invention seeks to fill that need.

BRIEF DESCRIPTION OF THE INVENTION

It has now been discovered, surprisingly, that it is possible to obtain improved brazability of honeycomb and fiber metal to a substrate, by masking a portion of the honeycomb and fiber metal prior to depositing $Al_2O_3$ on the honeycomb and fiber metal. The mask is then removed leaving an un-coated area prior to performing the brazing process.

According to one aspect, the present invention provides a process for brazing of $Al_2O_3$ coated honeycomb and fiber metal to a substrate, comprising applying a mask to a portion of said honeycomb and fiber metal prior to deposition of said $Al_2O_3$, and removing said mask prior to brazing. The process is particularly applicable to Stage 2 and Stage 3 shrouds.

The application of the mask to a portion of the honeycomb and fiber metal prior to deposition of the $Al_2O_3$ serves to protect a certain amount of the honeycomb and fiber metal from being coated with $Al_2O_3$. This has a number of advantages. First, the application of the masking material to the honeycomb and fiber metal is relatively easy. Secondly, little if any penetration of masking material by coating material occurs. Thirdly, the mask is easily removed after coating process.

DETAILED DESCRIPTION OF THE INVENTION

The present invention is based on the discovery that the brazability of the alumina coated honeycomb and fiber metal to a substrate can be improved if a portion of the honeycomb and fiber metal is masked prior to deposition of the alumina. The use of a mask provides a barrier which protects a certain portion of the honeycomb and fiber metal from being coated with $Al_2O_3$.

The masking material is applied to a portion of the honeycomb and fiber metal. The term "portion" as used herein means that the masking material is applied so as to cover no more than about 25% of the honeycomb and fiber metal, more usually no more than about 15% of the honeycomb and fiber metal.

Typically, the masking material employed in the process is conventional, for example titanium oxide. The masking material is usually in a water or lacquer-based suspension, as is known in the art, and is applied to the honeycomb and fiber metal using conventional techniques, such as painting or dipping. When as suspension is used, the masking material is typically present in the suspension in a concentration of about 30 to 40% by weight.

The masking material after drying is able to survive the coating treatment temperature in a CVD furnace in which alumina is deposited onto the masked honeycomb and fiber metal material. Typical temperatures are in the region of 850–1200° C., more typically about 1000° C.

Following the application of the $Al_2O_3$ coating, for example by conventional CVD techniques, the masking material can be removed. This is done typically by manually brushing the material off the surface, to expose the partially uncoated honeycomb and fiber metal material. The partially uncoated honeycomb and fiber metal material is now ready for brazing to a substrate.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A process of brazing an alumina-coated honeycomb and fiber metal material to a substrate, comprising applying a masking material to a portion of said honeycomb and fiber metal material prior to deposition of said $Al_2O_3$, and removing said masking material prior to brazing said alumina-coated honeycomb and fiber metal material to said substrate.

2. A process according to claim 1, wherein said substrate is a Stage 2 or Stage 3 shroud.

3. A process according to claim 1, wherein said masking material is titanium oxide.

4. A process according to claim 1 wherein said masking material is applied to cover no more than about 25% of said honeycomb and fiber metal material.

5. A process according to claim 1 wherein said mask material is applied to cover no more than about 15% of said honeycomb and fiber metal material.

6. A process according to claim 1 wherein said masking material is applied as an aqueous suspension.

7. A process according to claim 6 wherein said masking material is present in said suspension in a concentration of 30 to 40% by weight.

8. A process according to claim 1 wherein after deposition of said alumina, said masking material is removed from said honeycomb and fiber metal material.

9. A process according to claim 8, wherein said masking material is removed by brushing to produce part alumina coated honeycomb and fiber metal.

10. A process according to claim 9 wherein said alumina coated honeycomb and fiber metal material is brazed to a substrate.

* * * * *